United States Patent
Choi et al.

(10) Patent No.: US 9,006,779 B2
(45) Date of Patent: Apr. 14, 2015

(54) NITRIDE SEMICONDUCTOR LIGHT-EMITTING ELEMENT HAVING SUPERIOR LEAKAGE CURRENT BLOCKING EFFECT AND METHOD FOR MANUFACTURING SAME

(75) Inventors: Won-Jin Choi, Seongnam-si (KR); Jung-Won Park, Yongin-si (KR)

(73) Assignee: Iljin Led Co., Ltd., Ansan-Si, Gyeonggi-Do (KR)

( * ) Notice: Subject to any disclaimer, the term of this patent is extended or adjusted under 35 U.S.C. 154(b) by 0 days.

(21) Appl. No.: 14/237,302

(22) PCT Filed: Aug. 2, 2012

(86) PCT No.: PCT/KR2012/006179
§ 371 (c)(1),
(2), (4) Date: Feb. 5, 2014

(87) PCT Pub. No.: WO2013/022228
PCT Pub. Date: Feb. 14, 2013

(65) Prior Publication Data
US 2014/0167067 A1  Jun. 19, 2014

(30) Foreign Application Priority Data
Aug. 8, 2011 (KR) .................. 10-2011-0078779

(51) Int. Cl.
*H01L 33/32* (2010.01)
*H01L 33/22* (2010.01)
(Continued)

(52) U.S. Cl.
CPC ............... *H01L 33/32* (2013.01); *H01L 33/14* (2013.01)

(58) Field of Classification Search
CPC . H01L 21/02458; H01L 33/007; H01L 33/04; H01L 33/12
USPC .............. 257/96, 97, E33.049, 101, E33.028, 257/E33.034; 438/47
See application file for complete search history.

(56) References Cited

U.S. PATENT DOCUMENTS

| 6,051,847 A * | 4/2000 | Oku et al. ........................ 257/94 |
| 7,868,350 B2 * | 1/2011 | Kim ............................. 257/103 |
| 8,405,102 B2 * | 3/2013 | Yoon et al. ....................... 257/97 |

(Continued)

FOREIGN PATENT DOCUMENTS

| EP | 0993048 A2 | 4/2000 |
| KR | 1020040062636 A | 7/2004 |

(Continued)

OTHER PUBLICATIONS

International Search Report for PCT/KR2012/006179 mailed on Feb. 7, 2013.

(Continued)

*Primary Examiner* — Marvin Payen
*Assistant Examiner* — Jeremy Joy
(74) *Attorney, Agent, or Firm* — Lowe Hauptman & Ham, LLP (57) ABSTRACT

Disclosed are a nitride semiconductor light-emitting element and a method for manufacturing the same. The nitride semiconductor light-emitting element according to the present invention comprises: a current blocking part disposed between a substrate and an n-type nitride layer; an activation layer disposed on the top surface of the n-type nitride layer; and a p-type nitride layer disposed on the top surface of the activation layer, wherein the current blocking part is an $Al_x Ga_{(1-x)} N$ layer, and the Al content x times layer thickness (μm) is in the range of 0.01-0.06. Accordingly, the nitride semiconductor light-emitting element can increase the luminous efficiency by having a current blocking part which prevents current leakage from occurring.

12 Claims, 8 Drawing Sheets (51) Int. Cl.
*H01L 21/20* (2006.01)
*H01L 33/14* (2010.01)

(56) References Cited

U.S. PATENT DOCUMENTS

| | | | | |
|---|---|---|---|---|
| 8,563,995 | B2* | 10/2013 | Khan et al. | 257/89 |
| 2002/0063310 | A1 | 5/2002 | Kondo et al. | |
| 2006/0060873 | A1* | 3/2006 | Tu et al. | 257/97 |
| 2006/0278880 | A1* | 12/2006 | Lee et al. | 257/79 |
| 2009/0114933 | A1* | 5/2009 | Osawa et al. | 257/96 |
| 2010/0244077 | A1 | 9/2010 | Yao | |
| 2012/0175589 | A1* | 7/2012 | Ooshika et al. | 257/13 |

FOREIGN PATENT DOCUMENTS

| | | |
|---|---|---|
| KR | 1020080067536 A | 7/2008 |
| KR | 1020080069768 A | 7/2008 |
| KR | 1020090070980 A | 7/2009 |
| KR | 1020100037433 A | 4/2010 |
| KR | 20110045056 A | 5/2011 |
| WO | WO 2011024979 A1 * | 3/2011 |

OTHER PUBLICATIONS

Supplementary European Search Report dated Jan. 12, 2015.

* cited by examiner

NITRIDE SEMICONDUCTOR LIGHT-EMITTING ELEMENT HAVING SUPERIOR LEAKAGE CURRENT BLOCKING EFFECT AND METHOD FOR MANUFACTURING SAME

CROSS REFERENCE TO RELATED APPLICATION

This application claims the priority of Korean Patent Application No. 10-2011-0078779 filed on Aug. 8, 2011 in the Korean Patent and Trademark Office. Further, this application is the National Phase application of International Application No. PCT/KR2012/006179 filed on Aug. 2, 2012, which is incorporated herein by reference in its entirety.

TECHNICAL FIELD

The present invention relates to a nitride semiconductor light emitting device and a method for manufacturing the same, and more particularly, to a nitride semiconductor light emitting device capable of blocking leakage current and a method for manufacturing the same.

BACKGROUND ART

Figure 1:
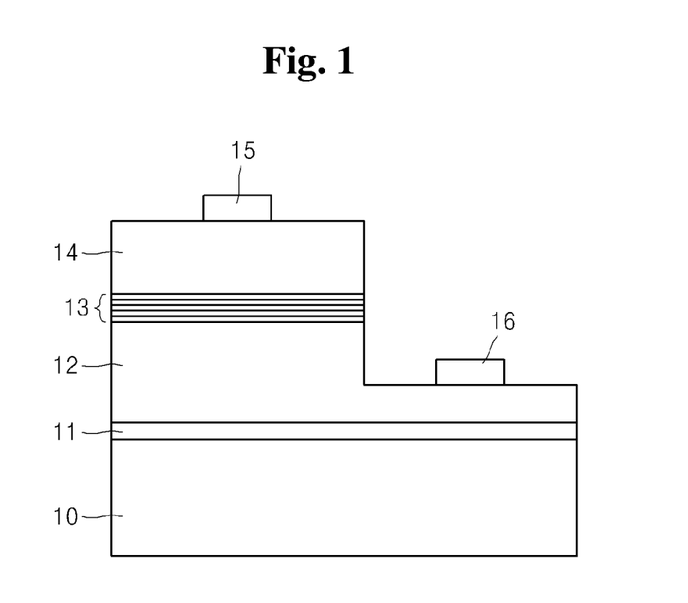
FIG. 1 is a schematic sectional view of a typical nitride semiconductor light emitting device.

FIG. 1 is a schematic sectional view of a typical nitride semiconductor light emitting device.

Referring to FIG. 1, a typical nitride semiconductor light emitting device includes a buffer layer 11, an n-type nitride layer 12, an activation layer 13 of a multi-quantum well structure, and a p-type nitride layer 14, which are sequentially stacked on a sapphire substrate 10. In addition, a p-side electrode 15 is formed on an upper surface of the p-type nitride layer 14 and an n-side electrode 16 is formed on an exposed surface of the n-type nitride semiconductor layer 12.

The nitride semiconductor light emitting device emits light through recombination of electrons and holes in the activation layer 13.

To improve luminous efficiency of the activation layer 13, various studies have been actively carried with the goal of improving light extraction efficiency, i.e., improving internal quantum efficiency and external quantum efficiency.

Improvement of internal quantum efficiency is generally achieved through improvement of luminous efficiency of light generated in the activation layer, as disclosed in Korean Patent Laid-open Publication No. 10-2010-0037433 (Apr. 9, 2010).

On the other hand, as the area of the nitride semiconductor light emitting device increases, it becomes difficult to achieve uniform current spreading. As a result, leakage current increases between the n-type nitride semiconductor layer and the buffer layer in the nitride semiconductor light emitting device. Such increase in leakage current provides low current density in the activation layer, causing deterioration of internal quantum efficiency.

DISCLOSURE

Technical Problem

An aspect of the present invention is to provide a nitride semiconductor light emitting device having improved light emitting efficiency by preventing current leakage.

Another aspect of the present invention is to provide a method for manufacturing the nitride semiconductor light emitting device.

Technical Solution

In accordance with one aspect of the present invention, a nitride semiconductor light emitting device includes: a current blocking part formed between a substrate and an n-type nitride layer; an activation layer formed on an upper surface of the n-type nitride layer; and a p-type nitride layer formed on an upper surface of the activation layer, wherein the current blocking part includes an insulating material.

In the nitride semiconductor light emitting device, the current blocking part may include at least one of an oxide layer, an undoped nitride layer, an oxide layer containing at least one of Ti, Fe and Cr as current blocking impurities, and a nitride layer containing at least one of Ti, Fe and Cr as the current blocking impurities, and an Al-containing nitride layer.

In the nitride semiconductor light emitting device, the current blocking part may be an Al-containing nitride layer, for example, an $Al_xGa_{(1-x)}N$ layer, where x ranges from 0.1 to 0.4, and may have a thickness from 0.02 μm to 0.5 μm.

More preferably, in the current blocking part of the nitride semiconductor light emitting device, a product (xT) of the aluminum content (x) and the thickness (T) of the current blocking part may range from 0.01 to 0.06.

In the nitride semiconductor light emitting device, the current blocking part may have a stack structure of at least three layers including a first current blocking layer formed in a direction of the substrate; a second current blocking layer formed on an upper surface of the first current blocking layer; and a third current blocking layer formed on an upper surface of the second current blocking layer. Here, the first current blocking layer is an n-AlGaN layer containing an n-type dopant, the second current blocking layer is a p-AlGaN layer containing a p-type dopant, and the third current blocking layer is an n-AlGaN layer containing an n-type dopant.

In accordance with another aspect of the present invention, a method for manufacturing a nitride semiconductor light emitting device includes: forming a current blocking part on a substrate; forming an n-type nitride layer on the current blocking part; forming an activation layer on the n-type nitride layer; and forming a p-type nitride layer on the activation layer, wherein the current blocking part contains an insulating material.

The forming a current blocking part may include forming a buffer layer between the substrate and the n-type nitride layer, and the current blocking part may be formed on or in at least one of an upper surface, a lower surface and an interior of the buffer layer.

Advantageous Effects

In the nitride semiconductor light emitting device and the method for manufacturing the same according to the present invention, a current blocking part capable of blocking current is formed such that current can flow towards the activation layer instead of leaking to the buffer layer and the substrate, thereby improving light emitting efficiency.

BEST MODE

Hereinafter, embodiments of the present invention will be described in more detail with reference to the accompanying drawings. Here, it should be understood that the present invention may be modified in various ways and is not limited to the following embodiments.

Figure 2:
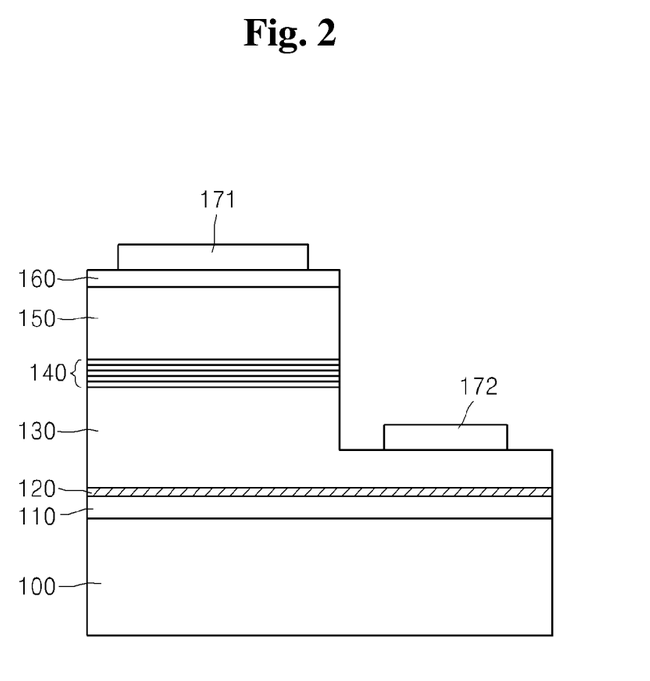
FIG. 2 is a sectional view of a nitride semiconductor light emitting device according to one embodiment of the present invention.

Referring to FIG. 2, a nitride semiconductor light emitting device according to one embodiment of the invention includes a substrate 100, a buffer layer 110, a current blocking part 120, an n-type nitride layer 130, an activation layer 140, a p-type nitride layer 150, a transparent electrode layer 160, a p-side electrode 171, and an n-side electrode 172.

The substrate 100 may be a GaN substrate, or a sapphire substrate having a convex-concave structure formed on an upper surface thereof.

The buffer layer 110 is optionally formed to cover an upper surface of the substrate 100 and may be formed of AlN or GaN to relieve lattice mismatch between the substrate 100 and the current blocking part 120. When the substrate 100 is the sapphire substrate having the convex-concave structure formed on the upper surface thereof, the buffer layer 110 may be formed to cover the substrate 100 such that the upper surface of the substrate 100 having the convex-concave structure is embedded in the buffer layer 110.

The current blocking part 120 is formed between the buffer layer 110 and the n-type nitride layer 130, and serves to block current such that the current flows only in the activation layer 140 without leaking to the buffer layer 110 and the substrate 100. Here, the current blocking part 120 may be formed on or in at least one of an upper surface, a lower surface and an interior of the buffer layer 110.

The current blocking part 120 may be formed of at least one of an oxide layer, an undoped nitride layer, an oxide or nitride layer containing at least one of Ti, Fe and Cr as current blocking impurities, and an Al-containing nitride layer. Specifically, the current blocking part 120 may be formed of an oxide layer such as $SiO_2$, an nitride layer, such as a SiN layer, an undoped-GaN layer and an InGaN layer, an oxide or nitride layer containing Ti, Fe, Cr, or the like as the current blocking impurities, or an AlGaN layer.

The thickness of the current blocking part 120 is determined depending upon the material of the layer. For example, when the current blocking part 120 is formed of an AlGaN layer, the current blocking part 120 may have a thickness from 0.02 μm to 0.5 μm. Here, if the thickness of the current blocking part 120 is less than 0.02 μm, the current blocking part 120 cannot block electric current, and if the thickness of the current blocking part 120 exceeds 0.5 μm, lattice mismatch occurs between the current blocking part 120 and the n-type nitride layer 130, thereby causing strain defects.

The n-type nitride layer 130 is formed on an upper surface of the current blocking part 120, and may have a stack structure in which, for example, a first layer formed of Si-doped AlGaN and a second layer formed of undoped GaN are alternately stacked one above another. Although the n-type nitride layer 130 may be a single nitride layer, the n-type nitride layer 130 having the stack structure of the first and second layers alternately stacked one above another may act as a carrier restriction layer having good crystallinity.

The activation layer 140 may be formed between the n-type nitride layer 130 and the p-type nitride layer 150, and may have a single quantum well structure or a multi-quantum well structure in which quantum well layers and quantum barrier layers are alternately stacked one above another. In this embodiment, the activation layer 140 may have a multi-quantum well structure wherein quantum barrier layers are formed of, for example, an Al-containing quaternary nitride layer of AlGaInN and quantum well layers are formed of, for example, InGaN. The activation layer 140 having such a multi-quantum well structure can suppress spontaneous polarization by stress and deformation.

The p-type nitride layer 150 may have, for example, a stack structure formed by alternately stacking a first layer formed of p-type AlGaN doped with Mg as a p-type dopant and a second layer formed of p-type GaN doped with Mg. In addition, the p-type nitride layer 150 may act as a carrier restriction layer like the n-type nitride layer 130.

The transparent electrode layer 160 is formed of a transparent conductive oxide on an upper surface of the p-type nitride layer 150 and may include an element, such as In, Sn, Al, Zn, Ga, or the like. For example, the transparent electrode layer 160 may be formed of at least one of ITO, CIO, ZnO, NiO, and $In_2O_3$.

In the nitride semiconductor light emitting device according to the embodiment of the invention, the current blocking part 120 is disposed between the buffer layer 110 and the n-type nitride layer 130, whereby current can flow only in the activation layer without leaking to the buffer layer 110 and the substrate 100 by insulation functions of the current blocking part 120.

Although the current blocking part 120 is illustrated as being disposed between the buffer layer 110 and the n-type nitride layer 130 in this embodiment, the present invention is not limited thereto. Alternatively, the current blocking part 120 may be formed between the substrate 100 and the buffer layer 110, or may be formed inside the buffer layer 110.

To verify efficiency of the current blocking part 120, the current blocking part 120 is formed as an AlGaN layer having a predetermined thickness between a 2 μm thick buffer layer 110 and a 4 μm thick n-type nitride layer 130 in a chip having, for example, a size of 1200 μm×600 μm. Here, in the current blocking part 120, the Al content may be adjusted in the range of 10 atom % to 40 atom % of a total number of aluminum (Al) and gallium (Ga) atoms, that is, by x in the range of 0.1 to 0.4 in Formula $Al_xGa_{(1-x)}N$.

Specifically, under the same conditions of other layers, the current blocking part 120 was formed of $Al_xGa_{(1-x)}N$ with the Al content and the layer thickness (μm) as shown in Table 1. Thereafter, a ratio (%) of a measured voltage of 2.1V or higher, that is, 1 μAVf yield, was obtained by application of a current of 1 μA.

TABLE 1

| Al content (x) | Layer thickness (μm) | Content × thickness | 1 μA Vf yield (%) |
|---|---|---|---|
| 0.05 | 0.1 | 0.005 | 36.3 |
| 0.1 | 0.1 | 0.01 | 84.3 |
| 0.17 | 0.1 | 0.017 | 95.2 |
| 0.23 | 0.1 | 0.023 | 98.6 |
| 0.3 | 0.1 | 0.03 | 65.8 |
| 0.05 | 0.2 | 0.01 | 55.2 |
| 0.1 | 0.2 | 0.02 | 90.3 |
| 0.17 | 0.2 | 0.034 | 91.3 |

TABLE 1-continued

| Al content (x) | Layer thickness (μm) | Content × thickness | 1 μA Vf yield (%) |
|---|---|---|---|
| 0.23 | 0.2 | 0.046 | 85.1 |
| 0.3 | 0.2 | 0.06 | 55.0 |

Referring to Table 1, it can be seen that 1 μAVf yield was improved when the product of the Al content (x) and the thickness (μm) was in the range of 0.01 to 0.06, thereby improving low current yield.

It can be considered that such characteristics were obtained due to the current blocking part 120, which provides a current blocking function to allow electric current to flow only in the activation layer 140 without leaking to the buffer layer 110 and the substrate 100.

Next, a nitride semiconductor light emitting device according to another embodiment of the invention will be described with reference to FIG. 3. Here, detailed descriptions of components and functions of the nitride semiconductor light emitting device apparent to those skilled in the art will be omitted for clarity.

Figure 3:
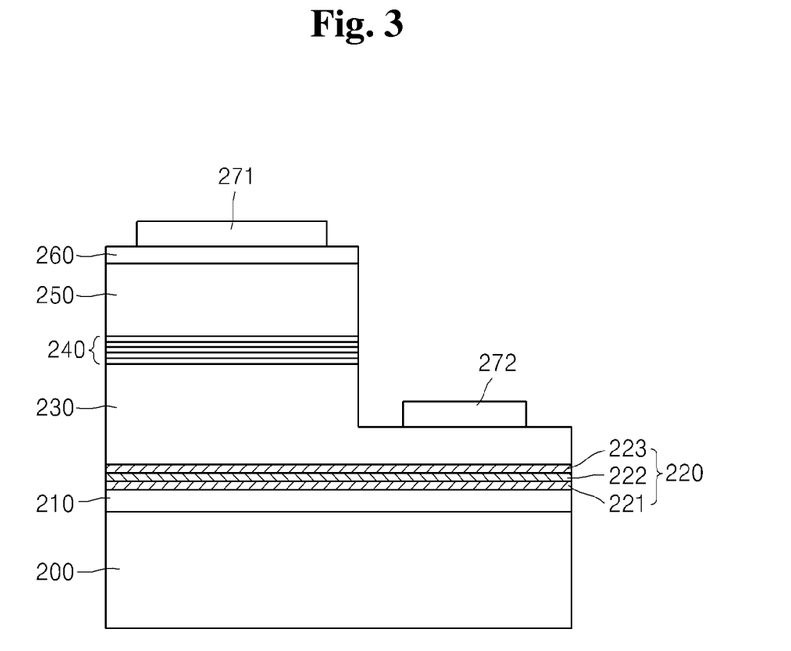
FIG. 3 is a sectional view of a nitride semiconductor light emitting device according to another embodiment of the present invention.

Referring to FIG. 3, the nitride semiconductor light emitting device according to another embodiment of the invention includes a substrate 200, a buffer layer 210, a current blocking part 220 having a stack structure of at least three layers, an n-type nitride layer 230, an activation layer 240, a p-type nitride layer 250, a transparent electrode layer 260, a p-side electrode 271, and an n-side electrode 272.

The current blocking part 220 may include a first current blocking layer 221, a second current blocking layer 222, and a third current blocking layer 223, which are sequentially formed on an upper surface of the buffer layer 210.

In the current blocking part 220, each of the current blocking layers 221, 222, 223 may be formed of at least one of an oxide layer, a nitride layer, an oxide or nitride layer containing at least one of Ti, Fe, and Cr as current blocking impurities, and an Al-containing nitride layer.

For example, each of the current blocking layers 221, 222, 223 may be formed of at least one layer selected from among these layers described above, such that the first current blocking layer 221 is formed of an oxide layer of $SiO_2$, the second current blocking layer 222 is formed of a nitride layer of undoped GaN, and the third current blocking layer 223 is formed of AlGaN.

Here, each of the first to third current blocking layers 221 to 223 may contain a different Al content in the range of 10 atom % to 40 atom % of a total number of Al and Ga atoms, and may have an n-p-n multilayer structure of an n-type dopant-containing AlGaN layer/p-type dopant-containing AlGaN layer/n-type dopant-containing AlGaN layer as n-type or p-type dopant-containing nitride layers.

Of course, each of the first to third current blocking layers 221 to 223 may be formed such that the product of the aluminum content (x) and the thickness (μm) of the current blocking part may range from 0.01 to 0.06.

Here, in the first current blocking layer 221 and the third current blocking layer 223, the concentration of the n-type dopant is higher than the concentration of the p-type dopant in the second current blocking layer 222.

In the nitride semiconductor light emitting device according to this embodiment, each of the first to third current blocking layers 221 to 223 has an n-type or p-type dopant-containing n-p-n nitride stack structure.

Thus, in the nitride semiconductor light emitting device according to this embodiment, junction regions of the p-type dopant-containing p-AlGaN layer become depletion regions due to the upper and lower high concentration n-type dopant-containing n-AlGaN layers in the current blocking part 220 having the n-p-n structure such that current flow is blocked by the junction regions, whereby current leakage to the buffer layer 210 and the substrate 200 can be completely blocked.

Hereinafter, a method for manufacturing a nitride semiconductor light emitting device according to another embodiment of the invention will be described with reference to FIG. 4 to FIG. 8. Here, in a description of the method for manufacturing the nitride semiconductor light emitting device according to this embodiment, the first to third current blocking layers 221 to 223 will be described as forming a current blocking part 220 having an n-type or p-type dopant-containing n-p-n nitride stack structure.

Figure 4:
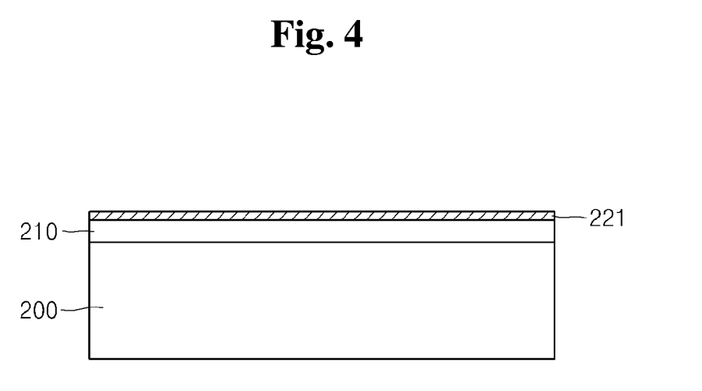
FIG. 4 to FIG. 8 shows sectional views illustrating a method for manufacturing a nitride semiconductor light emitting device according to another embodiment of the present invention.

To manufacture the nitride semiconductor light emitting device according to this embodiment, a buffer layer 210 and a first current blocking layer 221 are sequentially formed on an upper surface of a substrate 200, as shown in FIG. 4. Here, the substrate 200 may be a GaN substrate, or a sapphire substrate having a convex-concave structure formed on an upper surface thereof.

It should be understood that, before sequentially forming the buffer layer 210 and the first current blocking layer 221 on the upper surface of the substrate 200, a convex-concave structure may be formed on a sapphire substrate used as the substrate 200.

The buffer layer 210 may be optionally formed of AlN or GaN on the upper surface of the substrate 200 to relieve lattice mismatch between the substrate 200 and the first current blocking layer 221. When the substrate 200 is the sapphire substrate having the convex-concave structure on the upper surface thereof, the buffer layer 210 may be formed to cover the substrate 200 such that the upper surface of the substrate 200 having the convex-concave structure is embedded in the buffer layer 210.

After the buffer layer 210 is formed, the first current blocking layer 221 is formed on an upper surface of the buffer layer 210. The first current blocking layer 221 may be formed of at least one of an oxide layer, an undoped nitride layer, an oxide or nitride layer containing at least one of Ti, Fe and Cr as current blocking impurities, and an Al-containing nitride layer. Here, the Al-containing nitride layer may be an AlGaN layer.

Specifically, as the first current blocking layer 221, an n-AlGaN layer may be formed by any vapor epitaxial growth method selected from among atomic layer epitaxy (ALE), atmospheric pressure chemical vapor deposition (APCVD), metal organic chemical vapor deposition (MOCVD), plasma enhanced chemical vapor deposition (PECVD). It should be understood that the n-AlGaN layer may be formed as the first current blocking layer 221 through vapor epitaxial growth of an AlGaN layer, followed by ion implantation of an n-type dopant.

Here, the first current blocking layer 221 may be an n-AlGaN layer, wherein the Al content may be adjusted in the range of 10 atom % to 40 atom % of a total number of aluminum and gallium atoms, that is, by x ($0.1 \leq x \leq 0.4$) in Formula $Al_xGa_{(1-x)}N$. Preferably, the first current blocking layer 221 may be formed such that the product of the Al content (x) and the thickness (μm) thereof is in the range of 0.01 to 0.06.

Figure 5:
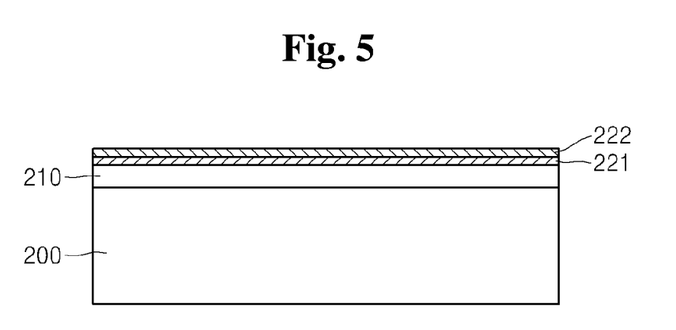

After the first current blocking layer 221 is formed, a second current blocking layer 222 of a p-AlGaN layer is formed on an upper surface of the first current blocking layer 221, as shown in FIG. 5. The second current blocking layer 222 may be formed of at least one of an oxide layer, an undoped nitride layer, an oxide or nitride layer containing at least one of Ti, Fe and Cr as current blocking impurities, and an $Al_xGa_{(1-x)}N$ layer ($0.1 \le x \le 0.4$).

Like the first current blocking layer 221, the second current blocking layer 222 is preferably formed as the p-AlGaN layer by any vapor epitaxial growth method selected from among ALE, APCVD, and PECVD such that the product of the Al content (x) and the thickness (μm) thereof is in the range of 0.01 to 0.06.

Figure 6:
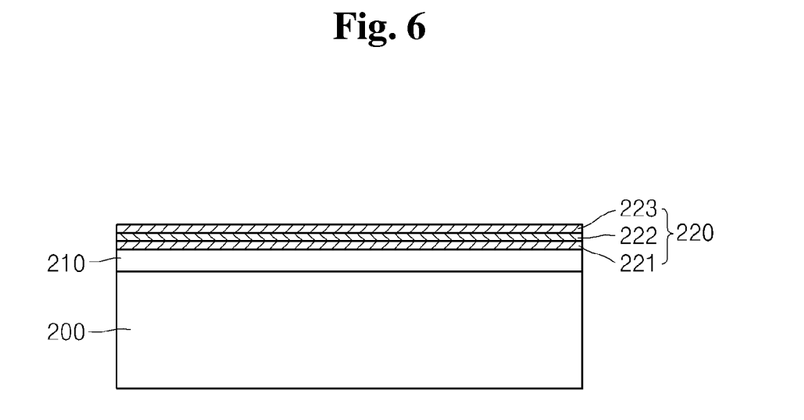

After the second current blocking layer 222 is formed, a third current blocking layer 223 of an n-AlGaN layer is formed on an upper surface of the second current blocking layer 222, as shown in FIG. 6. Like the first current blocking layer 221, the third current blocking layer 223 may be formed of at least one of an oxide layer, an undoped nitride layer, an oxide or nitride layer containing at least one of Ti, Fe and Cr as current blocking impurities, and an $Al_xGa_{(1-x)}N$ layer ($0.1 \le x \le 0.4$).

As in formation of the first current blocking layer 221, the third current blocking layer 223 is formed as the n-AlGaN layer by any vapor epitaxial growth method such that the product of the Al content and the thickness thereof is in the range of 0.01 to 0.06.

Figure 7:
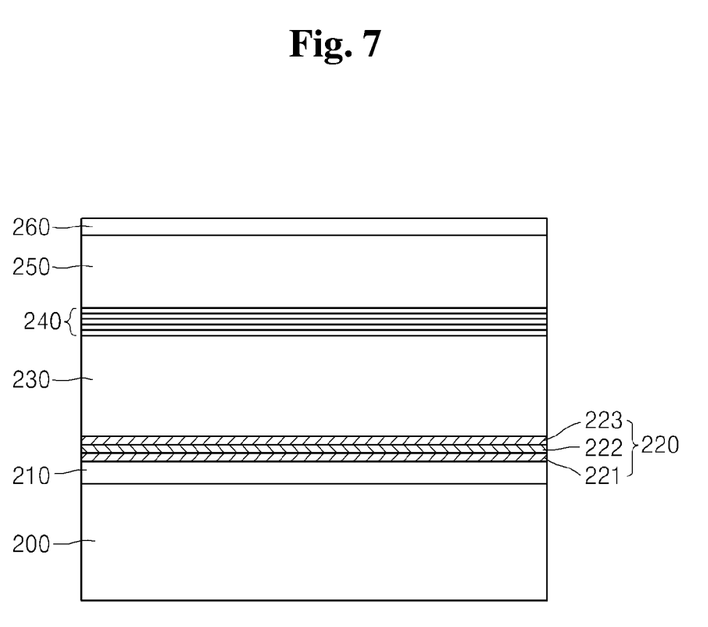

In this way, after the current blocking part 220 composed of the first to third current blocking layers 221 to 223 is formed, an n-type nitride layer 230 is formed on the upper surface of the third current blocking layer 223, as shown in FIG. 7. Although the current blocking part 220 is illustrated as being formed on the upper surface of the buffer layer 210 in this embodiment, the current blocking part 220 may also be formed on or in at least one of an upper surface, a lower surface and an interior of the buffer layer 210.

The n-type nitride layer 230 may be formed by growing an n-GaN layer while supplying a silane gas containing an n-type dopant, for example, NH3, trimethylgallium (TMG), and Si.

After the n-type nitride layer 230 is formed, an activation layer 240 is formed on an upper surface of the n-type nitride layer 230. The activation layer 240 may have a single quantum well structure or a multi-quantum well structure in which quantum well layers and quantum barrier layers are alternately stacked one above another. In this embodiment, the activation layer 240 has a multi-quantum well structure in which quantum well layers and quantum barrier layers are alternately stacked one above another.

For example, the activation layer 240 may have a multi-quantum well structure wherein quantum barrier layers are formed of, for example, an Al-containing quaternary nitride layer of AlGaInN and quantum well layers are formed of, for example, InGaN to suppress spontaneous polarization by stress and deformation.

After the activation layer 240 is formed, a p-type nitride layer 250 and a transparent electrode layer 260 are sequentially formed on an upper surface of the activation layer 240 as in a general method for manufacturing a nitride semiconductor light emitting device.

Figure 8:
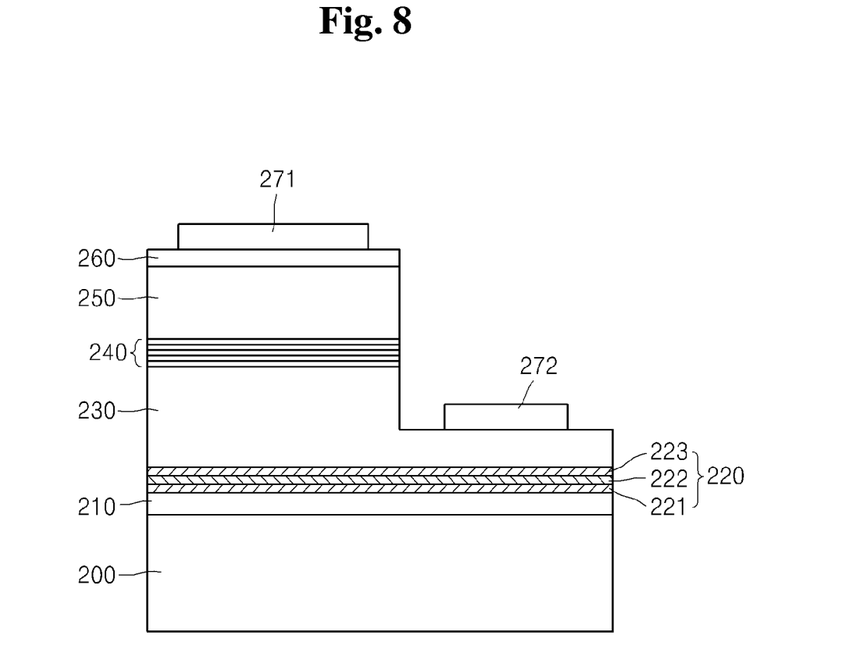

After the transparent electrode layer 260 is formed, some region of the n-type nitride layer 230 may be exposed through lithographic etching and cleaning from one region of the transparent electrode layer 260 to a portion of the n-type nitride layer 230, as shown in FIG. 8.

After some region of the n-type nitride layer 230 is exposed, a p-side electrode 271 and an n-side electrode 272 are formed on an upper surface of the transparent electrode layer 260 and the exposed region of the n-type nitride layer 230, respectively.

In the method for manufacturing the nitride semiconductor light emitting device according to this embodiment, the current blocking part 220 is formed to have the n-p-n nitride stack structure of an n-type dopant-containing AlGaN layer/p-type dopant-containing AlGaN layer/n-type dopant-containing AlGaN layer from the first current blocking layer 221 to the third current blocking layer 223. However, it should be understood that the current blocking part 220 according to the present invention is not limited thereto and may have a stack structure of three or more layers.

Thus, the method for manufacturing the nitride semiconductor light emitting device according to this embodiment may provide a nitride semiconductor light emitting device, which can further prevent current leakage to the buffer layer 210 and the substrate 200 using the current blocking part 220 having a stack structure of three or more layers.

Although some embodiments have been disclosed, it should be understood that these embodiments are provided for illustration only and are not to be construed in any way limiting the present invention.

In addition, it can be understood by those skilled in the art that various modifications can be made without departing from the spirit and scope of the present invention.

The invention claimed is:

1. A nitride semiconductor light emitting device, comprising:
   a current blocking part disposed between a substrate and an n-type nitride layer;
   an activation layer disposed on an upper surface of the n-type nitride layer; and
   a p-type nitride layer disposed on an upper surface of the activation layer,
   wherein the current blocking part has a stack structure of at least three layers including:
      a first current blocking layer;
      a second current blocking layer formed on an upper surface of the first current blocking layer; and
      a third current blocking layer formed on an upper surface of the second current blocking layer, and
      the first current blocking layer being an n-AlGaN layer containing an n-type dopant, the second current blocking layer being a p-AlGaN layer containing a p-type dopant, and the third current blocking layer being an n-AlGaN layer containing an n-type dopant.

2. The nitride semiconductor light emitting device according to claim 1,
   wherein the substrate has a convex-concave structure on an upper surface thereof.

3. The nitride semiconductor light emitting device according to claim 1, further comprising:
   a buffer layer disposed between the substrate and the n-type nitride layer,
   wherein the current blocking part is disposed on or in at least one of an upper surface, a lower surface and an interior of the buffer layer.

4. The nitride semiconductor light emitting device according to claim 1, wherein at least one of the first to third current blocking layers of the current blocking part comprises $Al_xGa_{(1-x)}N$ ($0.1 \le x \le 0.4$).

5. The nitride semiconductor light emitting device according to claim 4, wherein the current blocking part has a thickness ranging from 0.02 μm to 0.5 μm.

6. The nitride semiconductor light emitting device according to claim 1, wherein at least one of the first to third current blocking layers of the current blocking part comprises an Al$_x$Ga$_{(1-x)}$N layer (0.1≤x≤0.4), the product of an Al content (x) and a thickness (μm) of the Al$_x$Ga$_{(1-x)}$N layer is ranging from 0.01 to 0.06.

7. The nitride semiconductor light emitting device according to claim 1, wherein each of the first and third current blocking layers has a higher concentration of the n-type dopant than the concentration of the p-type dopant in the second current blocking layer.

8. The nitride semiconductor light emitting device according to claim 1, wherein the Al content ranges from 10 atom % to 40 atom % of a total number of aluminum and gallium atoms in the current blocking part.

9. The nitride semiconductor light emitting device according to claim 1, wherein each of the first to third current blocking layers is an Al$_x$Ga$_{(1-x)}$N (0.1≤x≤0.4) layer, the product of an Al content (x) and a thickness (μm) of the Al$_x$Ga$_{(1-x)}$N layer is ranging from 0.01 to 0.06.

10. A method for manufacturing a nitride semiconductor light emitting device, comprising:
   forming a current blocking part between a substrate and an n-type nitride layer;
   forming an activation layer on the n-type nitride layer; and
   forming a p-type nitride layer on the activation layer,
   wherein the forming a current blocking part comprises:
       forming a stack structure of at least three layers comprising a first current blocking layer formed of an n-type dopant containing AlGaN, a second current blocking layer formed of a p-type dopant containing AlGaN on an upper surface of the first current blocking layer, and a third current blocking layer formed of an n-type dopant containing AlGaN on an upper surface of the second current blocking layer.

11. The method for manufacturing a nitride semiconductor light emitting device according to claim 10, wherein each of the first, second and third current blocking layers has an aluminum content adjusted to be in the range of 10 atom % to 40 atom % of a total number of aluminum and gallium atoms.

12. The method for manufacturing a nitride semiconductor light emitting device according to claim 10, wherein the first current blocking layer and the third current blocking layer are formed as n-AlGaN layers through ion implantation of an n-type dopant into an AlGaN layer, and the second current blocking layer is formed as a p-AlGaN layer through ion implantation of a p-type dopant into an AlGaN layer.

* * * * *